(12) United States Patent
Guccione

(10) Patent No.: US 6,557,156 B1
(45) Date of Patent: *Apr. 29, 2003

(54) METHOD OF CONFIGURING FPGAS FOR DYNAMICALLY RECONFIGURABLE COMPUTING

(75) Inventor: Steven A. Guccione, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/546,460

(22) Filed: Apr. 10, 2000

Related U.S. Application Data

(63) Continuation of application No. 08/919,531, filed on Aug. 28, 1997, now Pat. No. 6,078,736.

(51) Int. Cl.[7] .......................... G06F 17/50; H03K 19/00
(52) U.S. Cl. ............................................. 716/17; 716/18
(58) Field of Search ................. 716/1, 16, 17, 716/18

(56) References Cited

U.S. PATENT DOCUMENTS

| | | | | |
|---|---|---|---|---|
| 5,109,353 | A | | 4/1992 | Sample et al. ............... 364/578 |
| 5,499,192 | A | | 3/1996 | Knapp et al. ................ 364/489 |
| 5,684,980 | A | | 11/1997 | Casselman ................... 395/500 |
| 5,802,290 | A | | 9/1998 | Casselman ................... 395/500 |
| 5,946,219 | A | * | 8/1999 | Mason et al. ................ 364/489 |
| 6,023,755 | A | * | 2/2000 | Casselman .................... 712/37 |
| 6,077,315 | A | * | 6/2000 | Greenbaum et al. ......... 717/144 |
| 6,078,736 | A | * | 6/2000 | Guccione ..................... 716/16 |
| 6,289,440 | B1 | * | 9/2001 | Casselman ................... 712/227 |

FOREIGN PATENT DOCUMENTS

| | | |
|---|---|---|
| EP | 0645723 | 3/1995 |
| WO | WO 94/10627 | 5/1994 |

OTHER PUBLICATIONS

Xilinx, Inc., "The Programmable Logic Data Book,", Sep. 1996, available from Xilinx, Inc., 2100 Logic Drive, San Jose, California 95124, pp. 4–251 to 4–286.

Eric Lechner and Steven A. Guccione: "The Java Environment for Reconfigurable Computing." Proceedings, Field–Programmable Logic and Applications, 7th International Workshop, FPL '97, London, UK Sep. 1–3, 1997, pp. 284–293.

Iseli et al; "A C ++ Compiler for FPGA Custom Execution Units Synthesis"; IEEE Symp. FPGAs for Custom Computing Machines; pp. 173–179.

Peterson et al; "Scheduling and Partitioning ANSI–C Programs into Multi–FPGA CCM Architecture"; pp. 178–187, No Date.

Guccione; "A Data–Parallel Programming Model for Reconfigurable Architecture", pp. 79–87. No date.

* cited by examiner

*Primary Examiner*—Leigh M. Garrowski
(74) *Attorney, Agent, or Firm*—Lois D. Cartier; Julie Stephenson; Bever Hoffman & Harms

(57) ABSTRACT

A method of configuring FPGAs for reconfigurable computing comprises a software environment for reconfigurable coprocessor applications. This environment comprises a standard high level language compiler (i.e. Java) and a set of libraries. The FPGA is configured directly from a host processor, configuration, reconfiguration and host run-time operation being supported in a single piece of code. Design compile times on the order of seconds and built-in support for parameterized cells are significant features of the inventive method.

22 Claims, 7 Drawing Sheets

```
Pci6200 pci6200 =   new Pci6200N(null);   // Hardware interface
pci6200.connect();
Register counterReg =      new Register(COLUMN, counterMap, pci6200);
Register clockReg =        new Register(COLUMN, clockMap, pci6200);
ClockMux localClock =      new ClockMux(ClockMux.CLOCK_IN);
ClockMux globalClock =     new ClockMux(ClockMux.GLOBAL_CLOCK);
ClearMux clear =           new ClearMux(ClearMux.ZERO);
Logic tff =                new Logic(Logic.T_FLIP_FLOP, Logic.EAST);
Logic clock =              new Logic(Logic.REGISTER);
Logic one =                new Logic(Logic.ONE);
Logic carry =              new Logic(Logic.AND, Logic.NORTH, logic.WEST);
carry.setEastOutput(Logic.NORTH);   // Set carry output
```

FIG. 5

```
/* Configure cells */
for (i=ROW_START; i<ROW_END; i++) {  // The counter
        carry.write((COLUMN-1), i, pci6200);
    tff.write(COLUMN, i, pci6200);
        localClock.write(COLUMN, i, pci6200);
      clear.write(COLUMN, i, pci6200);
    } /* end for */
one.write((COLUMN-1), (ROW_START-1), pci6200);  // Carry in
clock.write(COLUMN, (ROW_START-1), pci6200);  // Clock
localClock.set(ClockMux.NORTH_OUT);
localClock.write(COLUMN, ROW_START, pci6200);
globalClock.write(COLUMN, (ROW_START-1), pci6200);
```

FIG. 7

```
for (i=0; i<5; i++) {
        clockReg.set(0);  // Toggle clock
        clockReg.set(1);
        System.out.println("Count:  " + counterReg.get());
    } /*end for() */
```

FIG. 8A

```
C: \java\JERC> java Counter
Count:  0
Count:  1
Count:  2
Count:  3
Count:  4
C: \java\JERC>
```

FIG. 8B

METHOD OF CONFIGURING FPGAS FOR DYNAMICALLY RECONFIGURABLE COMPUTING

CROSS-REFERENCE TO RELATED APPLICATIONS

This application is a continuation application of commonly assigned, U.S. patent application Ser. No. 08/919,531 (now U.S. Pat. No. 6,078,736 which issued on Jun. 20, 2000), invented by Steven A. Guccione, entitled "A Method of Designing FPGAs for Dynamically Reconfigurable Computing" and filed Aug. 28, 1997, which is incorporated herein by reference.

BACKGROUND OF THE INVENTION

1. Field of the Invention

The present invention relates generally to the field of field programmable gate arrays (FPGAs) and more particularly to a method of configuring an FPGA using a host processor and a high level language compiler.

2. Description of the Background Art

In recent years, there has been an increasing interest in reconfigurable logic based processing. These systems use dynamically reconfigurable logic, such as FPGAs that can be reconfigured while in use, to implement algorithms directly in hardware, thus increasing performance.

By one count, at least 50 different hardware platforms (e.g., computers) have been built to investigate this novel approach to computation. Unfortunately, software has lagged behind hardware in this area. Most systems today employ traditional circuit design techniques, then interface these circuits to a host computer using standard programming languages.

Work done in high-level language support for reconfigurable logic based computing currently falls into two major approaches. The first approach is to use a traditional programming language in place of a hardware description language. This approach still requires software support on the host processor. The second major approach is compilation of standard programming languages to reconfigurable logic coprocessors. These approaches typically attempt to detect computationally intensive portions of code and map them to the coprocessor. These compilation tools, however, are usually tied to traditional placement and routing back-ends and have relatively slow compilation times. They also provide little or no run-time support for dynamic reconfiguration.

In general, today's tools are based on static circuit design tools originally developed for use in circuit board and integrated circuit design. The full potential of dynamic logic is not supported by such static design tools.

SUMMARY OF THE INVENTION

The method of design for reconfigurable computing (MDRC) of the invention represents a novel approach to hardware/software co-design for reconfigurable logic based coprocessors. A system and method are provided for configuring an FPGA directly from a host processor. It is not necessary to store the configuration data in a file, although it can be so stored if desired. Therefore, this method is particularly suited for use with FPGAs such as reconfigurable coprocessors, which are often reconfigured "on the fly", i.e., without repowering the FPGA and sometimes while reconfiguring only a portion of the FPGA. A description of the desired functionality for the FPGA is entered using the MDRC libraries and a standard high level language such as Java™. (Java is a trademark of Sun Microsystems, Inc.) Configuration, reconfiguration and host interface software for reconfigurable coprocessors is supported in a single piece of code.

Since MDRC does not make use of the traditional placement and routing approach to circuit synthesis, compilation times are significantly shorter than with prior art methods, being on the order of seconds. This high-speed compilation provides a development environment which closely resembles those used for modern software development.

The MDRC provides a simple alternative to traditional Computer Aided Design (CAD) tool based design. In the preferred embodiment, Java libraries are used to program an FPGA device. This method has the following benefits:

Very fast compilation times. Because standard programming language compilers are used by this approach, compilation is as fast as the host native compiler. With current Java compilers such as Microsoft's J++1.1 compiler compiling over 10,000 lines of code per second, compiling circuits built using MDRC will take on the order of a second to complete. This is in contrast to the hours of turnaround time in existing CAD tools.

Run time parameterization of circuits. Perhaps the most interesting feature of MDRC is its ability to do run-time parameterization of circuits. For instance, a constant adder, using a constant value known only at run-time, can be configured by MDRC during execution. The size of a given component may also be specified dynamically. A 5-bit adder or a 9-bit counter, for instance, can be configured at run-time. This feature has uses in areas such as adaptive filtering.

Object Oriented Hardware Design. Because Java is an object oriented language (i.e., a structured language in which elements are described in terms of objects and the connections between these objects), hardware designed in this language can make use of object-oriented support. Libraries constructed with MDRC may be packaged as objects and manipulated and reused like any standard software component.

Support for dynamic reconfiguration. The ability to dynamically configure a circuit automatically brings with it the ability to do dynamic reconfiguration. Uses for this capability are beginning to appear. For example, a portion of a dynamically reconfigurable FPGA could be configured as a multiplier that multiplies an input value by a constant, the constant being a scaling factor in a signal processing application. Using dynamic reconfiguration, this scaling factor could be changed without interrupting the function of other portions of the configured FPGA.

Standard software development environment. Using a standard programming language (in this case, Java) permits standard software environments to be used by circuit developers. In other words, widely available, off-the-shelf compilers such as Microsoft's J++1.1 compiler could be used to develop circuits to be implemented in an FPGA. This capability has two immediate advantages. First, the user can continue to use whichever tool he or she is already familiar with. Secondly, and perhaps most importantly, FPGA design becomes a software development effort open to programmers. This capability could greatly expand the existing base of FPGA users.

Simplified host interfacing. MDRC requires a host processor to be available for executing the Java code and supplying configuration data to the FPGA. This processor/FPGA combination is a powerful coprocessing environment currently being investigated by researchers. One barrier to use of these systems is the need to interface the FPGA hardware design with the host software design. MDRC merges the software and hardware design activities into a single activity, eliminating these interfacing issues.

Flexibility. Because MDRC comprises a library used by a standard programming language, it may be extended, even by users. This capability provides a level of flexibility unavailable in a static design tool. Users are free to provide new libraries and library elements, or even accessories such as custom graphical user interfaces.

Standard device interface. One way to think of MDRC is not so much as a tool in itself, but as a standard interface to the FPGA device. This interface may be used for FPGA configuration, or it may be used to build other tools. MDRC may even be used as the basis for traditional CAD software such as placement and routing tools. Another way to think of MDRC is as the "assembly language" of the FPGA.

Guaranteed "safe" circuits. MDRC provides an abstraction (a software construct that provides a representation, often simplified, of the hardware) which makes it impossible to produce circuits with contention problems. This makes it impossible when using MDRC to accidentally damage or destroy the device due to a bad configuration. Such protection is highly desirable in a dynamic programming environment like MDRC, where a programming error could otherwise result in permanently damaged hardware. (An incorrectly configured FPGA may inadvertently short power and ground together, destroying the device.) A side effect of this feature is that the MDRC may be used as an implementation vehicle for the emerging field of genetic algorithms.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings.

FIG. 5 is an element definition code listing for the basic elements of the embodiment of FIG. 4.

FIG. 7 is a configuration code listing for the counter of FIG. 4.

FIG. 8A is a run time code for the counter of FIG. 4.

FIG. 8B is an execution trace for the counter of FIG. 4.

DETAILED DESCRIPTION OF THE DRAWINGS

Figure 1:
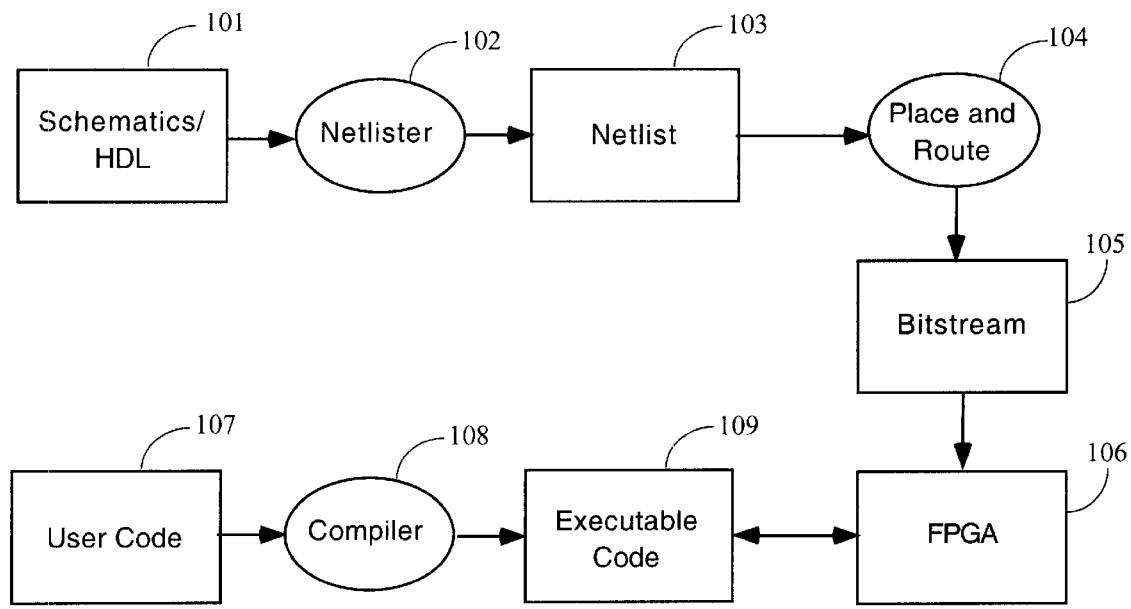
FIG. 1 is a block diagram illustrating the prior art design flow for design of a circuit implemented in an FPGA using a reconfigurable logic coprocessor.

Design of a circuit implemented in an FPGA using a reconfigurable logic coprocessor currently requires a combination of two distinct design paths, as shown in prior art FIG. 1. The first and perhaps most significant portion of the effort involves circuit design using traditional CAD tools.

The design path for these CAD tools typically comprises entering a design 101 using a schematic editor or hardware description language (HDL), using a netlister 102 to generate a netlist 103 for the design, importing this netlist into an FPGA placement and routing tool 104, which finally generates a bitstream file 105 of configuration data which is used to configure FPGA 106.

Once the configuration data has been produced, the next task is to provide software to interface the host processor to the FPGA. The user enters user code 107 describing the user interface instructions, which is then compiled using compiler 108 to produce executable code 109. The instructions in executable code 109 are then used by the processor to communicate with the configured FPGA 106. It is also known to use executable code 109 to control the configuration of FPGA 106 with bitstream file 105. This series of tasks is usually completely decoupled from the task of designing the circuit and hence can be difficult and error-prone.

In addition to the problems of interfacing the hardware and software in this environment, there is also the problem of design cycle time. Any change to the circuit design requires a complete pass through the hardware design tool chain (101–106 in FIG. 1). This process is time consuming, with the place and route portion of the chain typically taking several hours to complete.

Finally, this approach provides no support for reconfiguration. The traditional hardware design tools provide support almost exclusively for static design. It is difficult to imagine constructs to support run-time reconfiguration in environments based on schematic or HDL design entry.

In contrast, the MDRC environment comprises a library of elements which permit logic and routing to be specified and configured in a reconfigurable logic device. By making calls to these library elements, circuits may be configured and reconfigured. Additionally, host code may be written to interact with the reconfigurable hardware. This permits all design data to reside in a single system, often in a single Java source code file.

Figure 2:
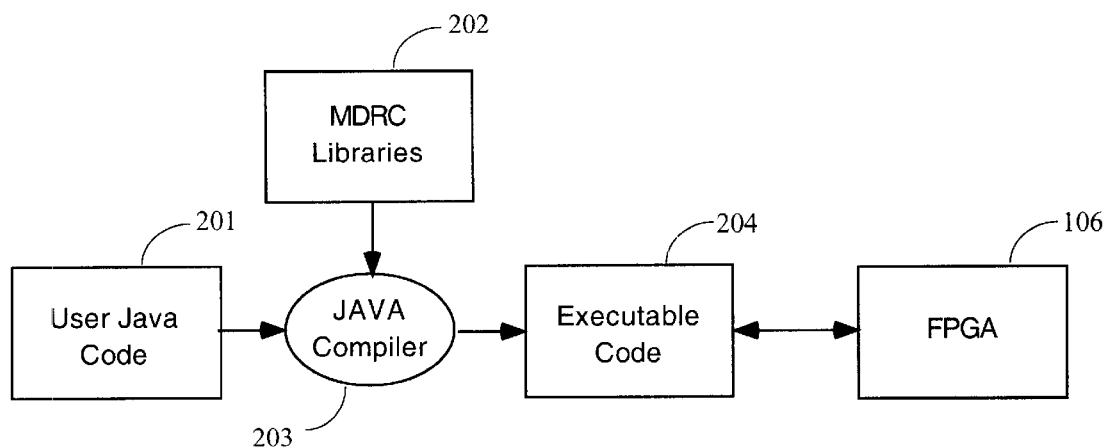
FIG. 2 is a block diagram illustrating the design flow in the present invention.

In addition to greatly simplifying the design flow, as shown in FIG. 2, the MDRC approach also tightly couples the hardware and software design processes. Design parameters for both the reconfigurable hardware and the host software are shared. This coupling provides better support for the task of interfacing the logic circuits to the software.

As shown in FIG. 2, entering and compiling an FPGA circuit using the MDRC method requires many fewer steps than in the prior art method of FIG. 1. User code 201, in this embodiment Java code, is entered. This code includes not just instructions describing the user interface and the configuration process, but also a high-level description of the desired FPGA circuit. This circuit description comprises calls to library elements (function calls) in MDRC libraries 202. In one embodiment, these cells can be parameterized. Java compiler 203 combines the circuit descriptions from MDRC libraries 202 with the instructions from user code 201 to generate executable code 204. Executable code 204 includes not only user interface instructions, as in executable code 109 of FIG. 1, but also configuration instructions. When using MDRC, the bitstream need not be stored as a file; if desired the configuration data can be directly downloaded to FPGA 106 by executable code 204. This technique is particularly useful in reconfigurable computing, i.e., when using a reconfigurable FPGA as a coprocessor to perform a series of different computations for a microprocessor.

The MDRC Abstraction

MDRC takes a layered approach to representing the reconfigurable logic. At the lowest (most detailed) layer, called Level 0, MDRC supports all accessible hardware resources in the reconfigurable logic. Extensive use of constants and other symbolic data makes Level 0 usable, in spite of the necessarily low level of abstraction.

The current platform for the MDRC environment is the XC6200DS Development System manufactured by Xilinx, Inc. the assignee of the present invention. The XC6200DS Development System comprises a PCI board containing a Xilinx XC6216 FPGA. In the XC6200 family of FPGAs, Level 0 support comprises abstractions for the reconfigurable logic cells and all routing switches, including the clock routing. The code for Level 0 is essentially the bit-level information in the XC6200 Data Sheet coded into Java. (The "XC6200 Data Sheet" as referenced herein comprises pages 4-251 to 4-286 of the Xilinx 1996 Data Book entitled "The Programmable Logic Data Book", published September 1996, available from Xilinx, Inc., 2100 Logic Drive, San Jose, Calif. 95124, which are incorporated herein by reference. (Xilinx, Inc., owner of the copyright, has no objection to copying these and other pages referenced herein but otherwise reserves all copyright rights whatsoever.)

While Level 0 provides complete support for configuring all aspects of the device, it is very low level and may be too tedious and require too much specialized knowledge of the architecture for most users. Although this layer is always available to the programmer, it is expected that Level 0 support will function primarily as the basis for the higher layers of abstraction. In this sense, Level 0 is the "assembly language" of the MDRC system.

Above the Level 0 abstraction is the Level 1 abstraction. This level of abstraction permits simpler access to logic definition, clock and clear routing, and the host interface.

The most significant portion of the Level 1 abstraction is the logic cell definition. Using the logic cell definition, one logic cell in the XC6200 device can be configured as a standard logic operator. In one embodiment, AND, NAND, OR, NOR, XOR, XNOR, BUFFER and INVERTER combinational logic elements are supported. These elements may take an optional registered output. Additionally, a D flip-flop and a register logic cell are defined. In one embodiment, a latch cell is defined instead of or in addition to the flip-flop element. All of these logic operators are defined exclusively using MDRC level 0 operations, and hence are easily extended.

Figure 3:
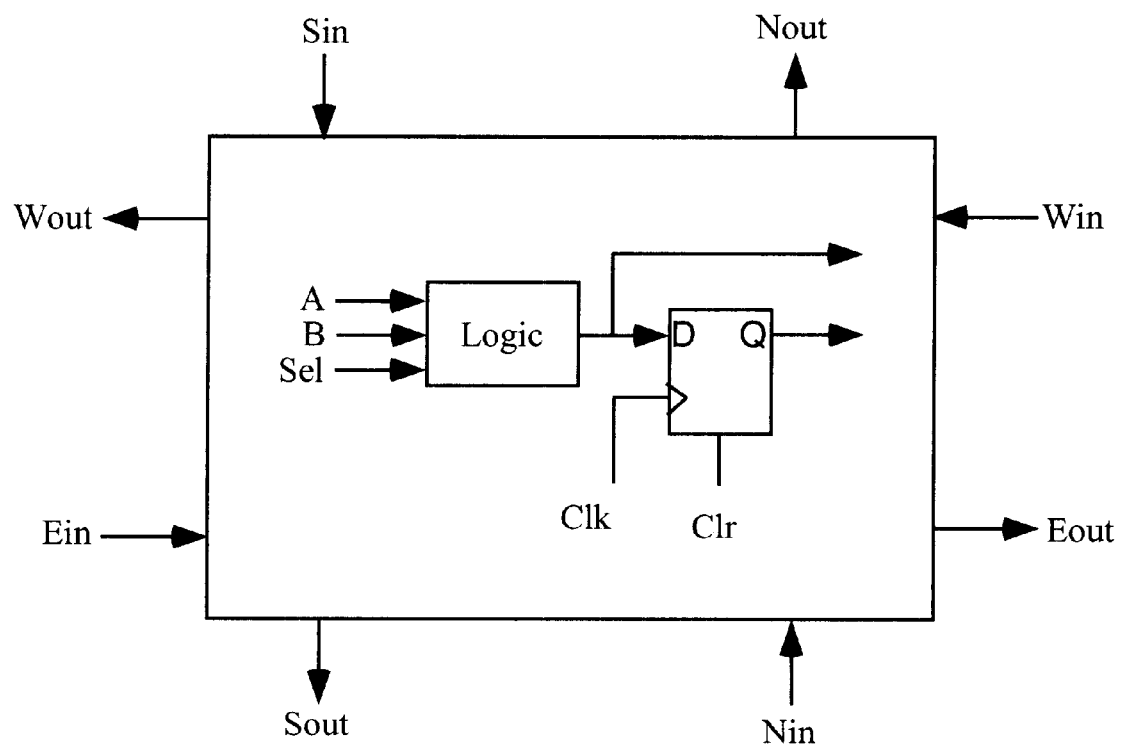
FIG. 3 is a diagram of a level 1 logic cell abstraction of the present invention.
Figure 3A:
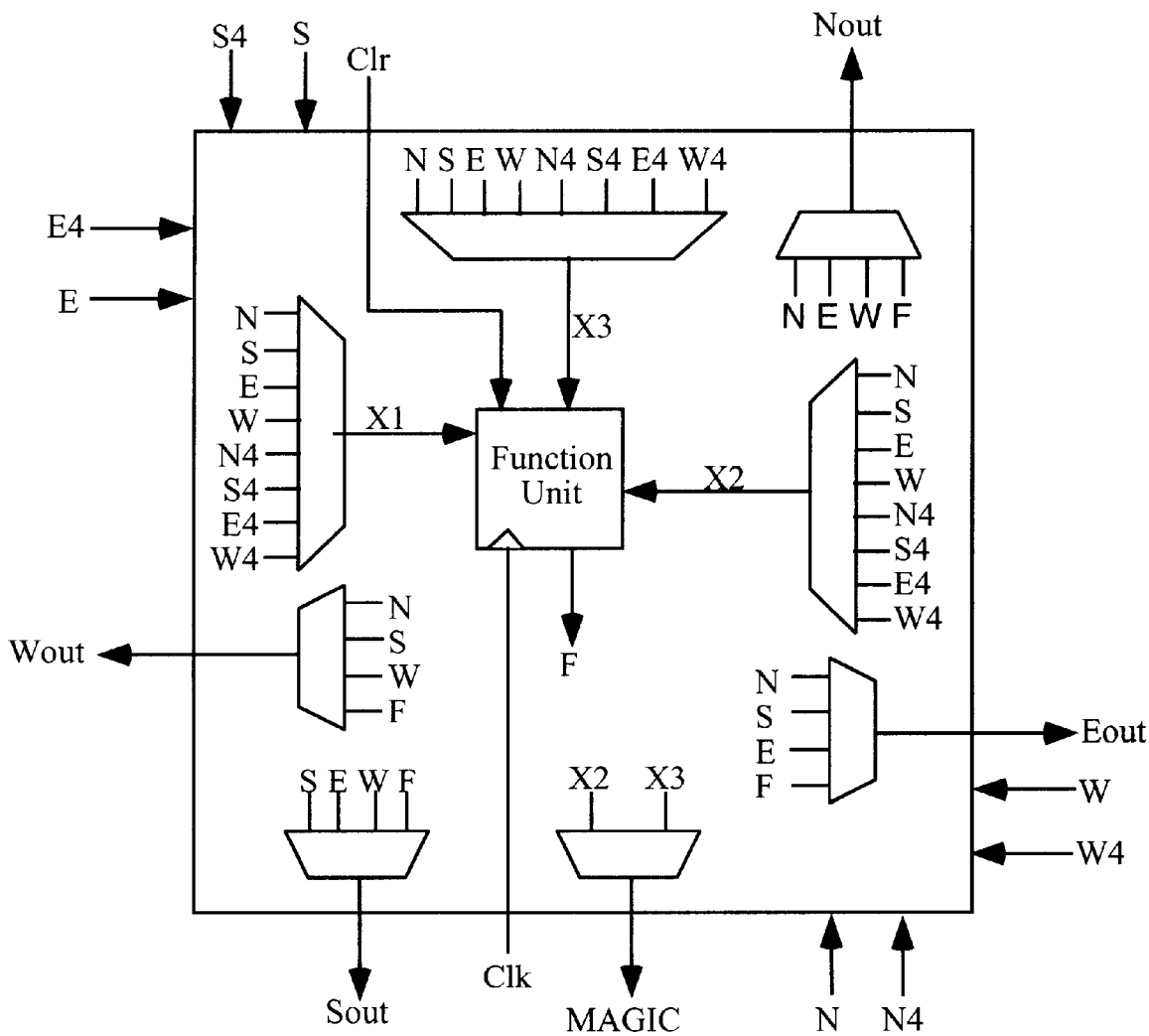
FIG. 3A is a diagram of an XC6200 logic cell represented by the abstraction of FIG. 3.

FIG. 3 is a diagram of the Level 1 logic cell abstraction. Outputs Nout, Eout, Sout, Wout correspond to the outputs of the same names in the XC6200 logic cell, as pictured on page 4-256 of the XC6200 data sheet, which is incorporated herein by reference. The XC6200 logic cell is also shown in FIG. 3A herein. Input Sin of FIG. 3 corresponds to input S of the logic cell of FIG. 3A, input Win corresponds to input W, Nin to N, and Ein to E. The Level 1 abstraction shown in FIG. 3 is a simplified representation of the XC6200 logic block. In this embodiment, for example, inputs S4, W4, N4, and E4 are not supported in the Level 1 abstraction, although they are supported in the Level 0 abstraction. The Logic block and flip-flop shown in FIG. 3 signify the circuits available in one XC6200 logic cell. Inputs A, B, and SEL in FIG. 3 (corresponding to inputs X1, X2, and X3 of FIG. 3A) are the inputs to the Logic block; they can be mapped to any of logic cell inputs Sin, Win, Nin, and Ein. The circuits available in one logic cell differ in other FPGA devices.

In addition to the logic cell abstraction, the clock routing is abstracted. Various global and local clock signals (such as Clk and Clr in FIG. 3) may be defined and associated with a given logic cell.

A third portion of the MDRC Level 1 abstraction is the register interface. In the XC6200 device, columns of cells may be read or written via the bus interface, the columns of cells thus forming read/write registers. The Register interface allows registers to be constructed and accessed symbolically.

An Example

Figure 4:
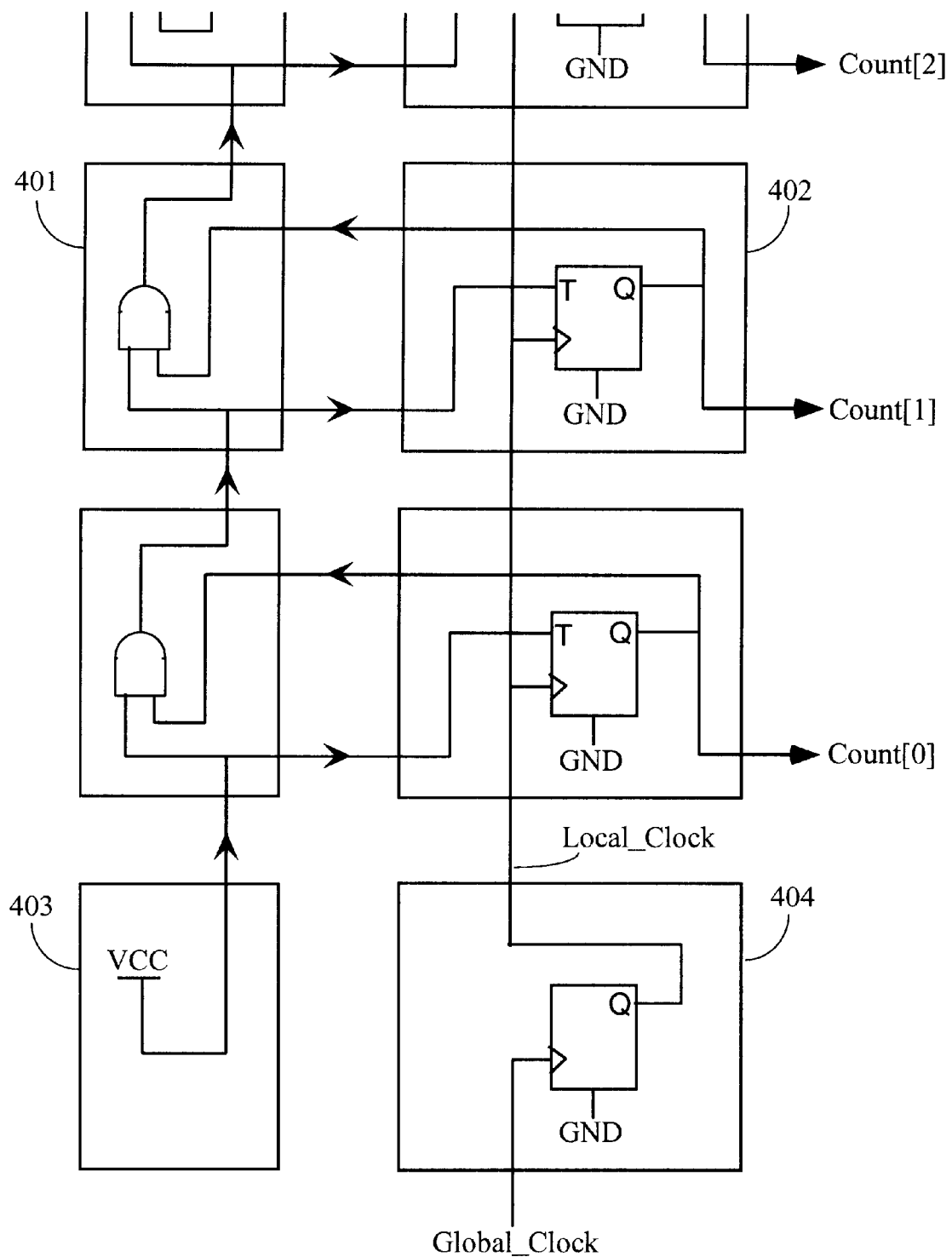
FIG. 4 is a diagram of a multi-bit counter according to one embodiment of the invention.

FIG. 4 shows a simple counter designed for an XC6200 device, based on toggle flip-flops 402 and carry logic 401 using the Level 1 abstraction. In less than 30 lines of code, the circuit is described and configured, and clocking and reading of the counter value is performed. In addition, the structure of this circuit permits it to be easily packaged as a parameterized object, with the number of bits in the counter being set via a user-defined parameter. Such an object-based approach would permit counters of any size to be specified and placed at any location in the XC6200 device. Once implemented, the counter of FIG. 4 could also be placed in a library of parameterized macrocells.

The implementation process is fairly simple. First, the logic elements required by the circuit are defined. These circuit element definitions are abstractions and are not associated with any particular hardware implementation.

Once these logic elements are defined, they may be written to the hardware, configuring the circuit. Once the circuit is configured, run time interfacing of the circuit, usually in the form of reading and writing registers and clocking the circuit, is performed. If the application demands it, the process may be repeated, with the hardware being reconfigured as necessary.

The counter example contains nine basic elements. Five basic elements provide all necessary support circuitry to read, write, clock and clear the hardware. The remaining basic elements are used to define the counter circuit itself. These elements are best seen by looking at FIG. 5 in conjunction with FIG. 4. FIG. 5 gives the MDRC code for describing the basic elements. The pci6200 object passed to each of the two register definitions is the hardware interface to the XC6200DS PCI board.

The support circuitry includes two registers which simply interface the circuit to the host software. These two registers are used to read the value of the counter ("Register counterReg" in FIG. 5) and to toggle a single flip-flop 404, producing the local clock ("Register clockReg" in FIG. 5). To support the flip-flops in the XC6200 device, clock and clear (reset) inputs must also be defined. The global clock ("ClockMux globalClock" in FIG. 5) is the system clock for the device and must be used as the clock input to any writable register. In this circuit, the flip-flop which provides the software-controlled local clock must use the global clock. The local clock ("ClockMux localClock" in FIG. 5) is the output of the software controlled clock, and must be routed to the toggle flip-flops which make up the counter. Finally, all flip-flops in the XC6200 device need a clear input ("ClearMux clear" in FIG. 5). In this embodiment, the clear input to all flip-flops is simply set to logic zero (GND).

Figure 6A:
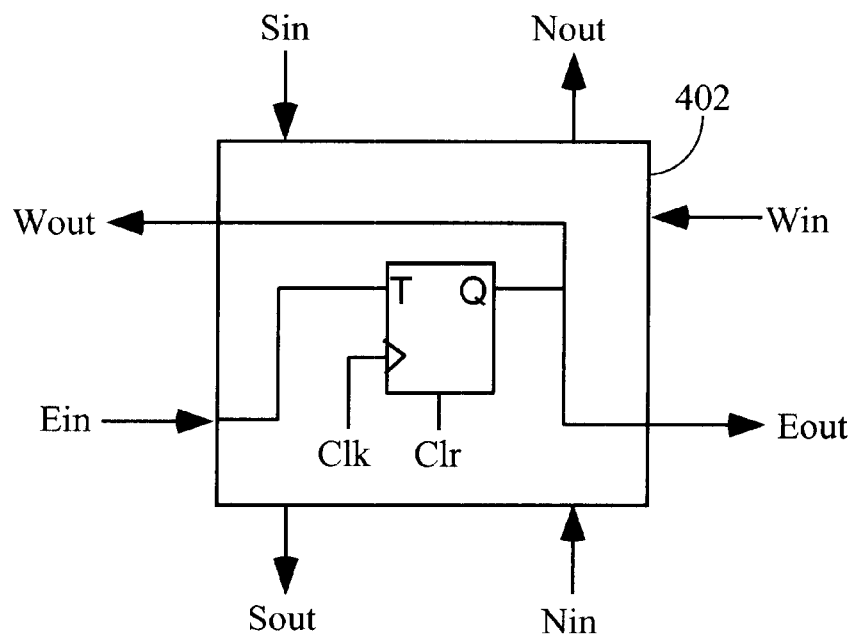
FIG. 6A is a diagram of a toggle flip-flop cell of the embodiment of FIG. 4.
Figure 6B:
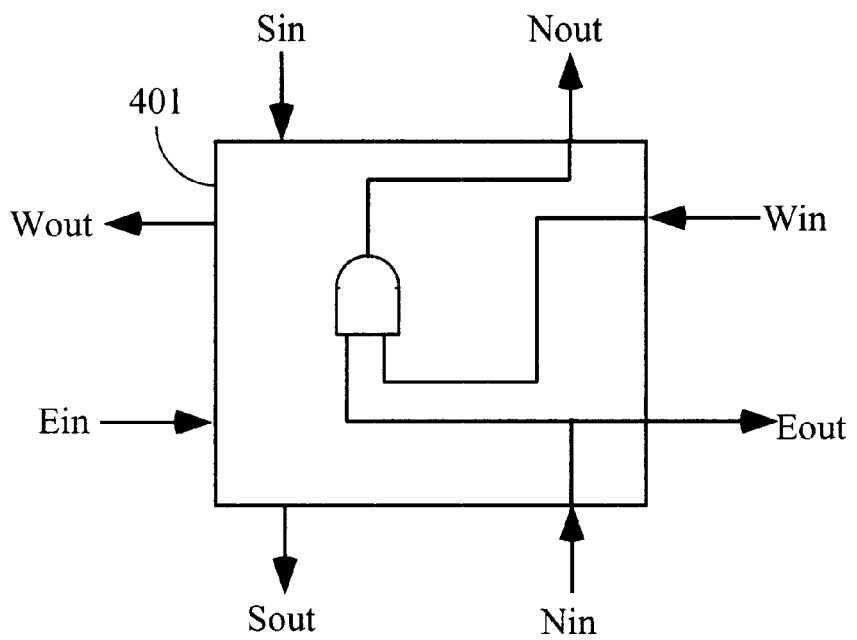
FIG. 6B is a diagram of a carry logic cell of the embodiment of FIG. 4.

The first logic element in the counter circuit is the clock ("Logic clock" in FIG. 5). This element is just a single bit register 404 (FIG. 4) which is writable by the software. Toggling register 404 via software control produces clock Local_clock for the counter circuit. The next counter circuit element is a toggle flip-flop such as flip-flop 402, ("Logic tff" in FIG. 5). This flip-flop is defined as having an input coming from the west. (According to the standard XC6200 data sheet nomenclature, the names Logic.EAST and Ein denote an east-bound signal, i.e., a signal coming from the west.) The toggle flip-flop element provides the state storage for the counter. Next, the carry logic element 401 for the counter ("Logic carry" in FIG. 5) is simply an AND-gate with inputs from the previous stage carry logic and the output of the current stage toggle flip-flop. The carry element generates the "toggle" signal for the next stage of the counter. FIGS. 6A and 6B are graphical representations of the flip-flop and carry logic cells, respectively, in an XC6200 device. Finally, a logical "one" or VCC cell ("Logic one" in FIG. 5, block 403 in FIG. 4) is implemented for the carry input to the first stage of the counter.

Once this collection of abstract elements is defined, they may be instantiated anywhere in the XC6200 cell array. This instantiation is accomplished by making a call to the write( ) function associated with each object. This function takes a column and row parameter which define the cell in the XC6200 device to be configured. Additionally, the hardware interface object is passed as a parameter. In this case, all configuration is done to pci6200, a single XC6200DS PCI board.

An example of this instantiation is shown in FIG. 7, which instantiates the elements for the counter of FIG. 4. The code in FIG. 7 performs all necessary configuration. In the for( ) loop, the carry cells (401 in FIG. 4) are in one column with the toggle flip-flops tff (402 in FIG. 4) in the next column. A local clock and a clear are attached to each toggle flip-flop tff. The relative location of these cells is shown in FIG. 4.

Below the for( ) loop, a constant "1" is set as the input to the carry chain (403 in FIG. 4). Next, the software-controlled clock (Local_clock in FIG. 4) is configured. This is the clock object, with its localClock routing attached to the toggle flip-flops tff of the counter. Finally, the global clock is used to clock the software-controlled local clock. In some embodiments, the clock and clear basic elements are not required; in this embodiment their presence is necessary to support the XC6200 architecture.

Once the circuit is configured, it is a simple matter to read and write the Register objects via the get( ) and set( ) functions, respectively. In FIG. 8A, the clock is toggled by alternately writing "0" and "1" to the clock register (404 in FIG. 4). The counter register (not shown) is used to read the value of the counter (outputs COUNT[0], COUNT[1], COUNT[2], etc.). FIG. 8B shows an actual trace of the execution of this code running on the XC6200DS development system.

CONCLUSIONS

While this example is a simple one for demonstration purposes, it makes use of all the features of MDRC. These features include register reads and writes, as well as features such as software-driven local clocking. Other more complex circuits have also been developed using MDRC. More complex circuits are built using the same basic features; the primary difference is in the size of the code.

MDRC provides a simple, fast, integrated tool for reconfigurable logic based processing. MDRC is currently a manual tool, since it is desirable for the programmer to exercise tight control over the placement and routing of circuits for reconfigurable computing. However, MDRC provides very fast compilation times in exchange for the manual design style. The compile times necessary to produce these circuits and run-time support code is on the order of seconds, many orders of magnitude faster than the design cycle time of traditional CAD tools. This unusual speed permits development in an environment that is similar to a modern integrated software development environment. Additionally, the object-oriented nature of Java permits libraries of parameterized cells to be built. This feature could significantly increase the productivity of MDRC users.

MDRC may be used as a basis for a traditional graphical CAD tool. This approach would be useful for producing static circuits.

The above text describes the MDRC in the context of FPGAs used for dynamically reconfigurable computing, such as the Xilinx XC6200 family of FPGAs. However, the invention can also be applied to other FPGAs and other software programmable ICs not used for dynamically reconfigurable computing.

Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method of generating configuration information for a field programmable gate array (FPGA), the FPGA being connected to a host processor for configuration thereby; the method comprising:

programming the host processor with instructions in a programming language;

instantiating elements from a library of elements compatible with the programming language; and generating executable code in response to the programmed instructions and the instantiated library elements, the executable code including compiled placement and routing information.

2. The method of claim 1, further comprising providing a compiler for the programming language to the host processor.

3. The method of claim 1, further comprising:

executing the executable code; and configuring the FPGA from the host processor in response to executing the executable code.

4. The method of claim 1, wherein the FPGA is capable of dynamically reconfigurable computing.

5. The method of claim 4, further comprising reconfiguring at least a portion of the FPGA.

6. The method of claim 5, further wherein reconfiguring at least a portion of the FPGA is in response to executing the executable code.

7. The method of claim 5, wherein reconfiguring at least a portion of the FPGA occurs during operation of the FPGA.

8. The method of claim 1, wherein the programming language is a high level programming language.

9. The method of claim 8, wherein the high level programming language is part of a Java environment.

10. The method of claim 1, further comprising using the instantiated library elements to generate a parameterized cell.

11. The method of claim 10, wherein the parameterized cell is a counter parameterized by the number of bits in the counter.

12. A method of configuring a field programmable gate array (FPGA) for dynamically reconfigurable computing, the method comprising:

programming a host processor with instructions in a programming language;

generating executable code in response to the programmed instructions, the executable code including compiled placement and routing information; and connecting the host processor to the FPGA for configuration of the FPGA by the host processor via the executable code.

13. The method of claim 12, wherein the programming language is a high level programming language.

14. The method of claim 13, wherein the high level programming language is part of a Java environment.

15. The method of claim 12, further comprising providing a compiler for the programming language to the host processor.

16. The method of claim 15, further comprising instantiating elements from a library of elements compatible with the compiler.

17. The method of claim 12, wherein the host processor comprises a compiler for the programming language, the method further comprising instantiating elements from a library of elements compatible with the compiler.

18. The method of claim 17, further comprising using the instantiated library elements to generate a parameterized cell.

19. The method of claim 18, wherein the parameterized cell is a counter parameterized by the number of bits in the counter.

20. The method of claim 12, further comprising:
   executing the executable code; and
   reconfiguring at least a portion of the FPGA in response to executing the executable code.

21. The method of claim 20, wherein reconfiguring at least a portion of the FPGA is accomplished via the host processor.

22. The method of claim 20, wherein reconfiguring at least a portion of the FPGA occurs during operation of the FPGA.

* * * * *